(12) United States Patent
Yu et al.

(10) Patent No.: US 8,331,494 B1
(45) Date of Patent: Dec. 11, 2012

(54) COMBINED DIGITAL DOWN CONVERSION (DDC) AND DECIMATION FILTER

(75) Inventors: Mao Yu, San Jose, CA (US); Xiangdong Jin, Sunnyvale, CA (US)

(73) Assignee: Marvell International Ltd. (BM)

( * ) Notice: Subject to any disclaimer, the term of this patent is extended or adjusted under 35 U.S.C. 154(b) by 464 days.

(21) Appl. No.: 12/624,353

(22) Filed: Nov. 23, 2009

Related U.S. Application Data

(60) Provisional application No. 61/118,194, filed on Nov. 26, 2008.

(51) Int. Cl.
    *H03K 9/06* (2006.01)
(52) U.S. Cl. .......................... 375/322; 329/345
(58) Field of Classification Search .............. 375/322; 329/345
    See application file for complete search history.

(56) References Cited

U.S. PATENT DOCUMENTS

| | | | | |
|---|---|---|---|---|
| 5,381,446 A * | 1/1995 | McIntosh | ...... | 375/150 |
| 5,786,782 A * | 7/1998 | Ostman et al. | ...... | 341/141 |
| 5,818,883 A * | 10/1998 | Smith et al. | ...... | 375/347 |
| 5,838,736 A * | 11/1998 | Thomas et al. | ...... | 375/329 |
| 5,937,341 A * | 8/1999 | Suominen | ...... | 455/324 |
| 6,294,952 B1 * | 9/2001 | Kato | ...... | 329/306 |
| 6,545,626 B1 * | 4/2003 | Nakada | ...... | 341/155 |
| 7,388,931 B1 * | 6/2008 | Hsu et al. | ...... | 375/316 |
| 7,528,754 B1 * | 5/2009 | Bakkaloglu et al. | ...... | 341/143 |
| 2002/0045427 A1 * | 4/2002 | Lahti et al. | ...... | 455/97 |
| 2008/0002788 A1 * | 1/2008 | Akhtar et al. | ...... | 375/298 |
| 2010/0124257 A1 * | 5/2010 | Yahya | ...... | 375/219 |

\* cited by examiner

*Primary Examiner* — Juan A Torres

(57) ABSTRACT

In one embodiment, an analog-to-digital converter (ADC) receives a radio frequency (RF) signal and converts the RF signal into a digital signal at an intermediate frequency. The ADC uses a sampling frequency that is a multiple of the intermediate frequency to perform the conversion. A selector receives the digital signal and outputs a combined in phase and quadrature signal at a plurality of sampling points based on the sampling frequency. A filter receives the combined in phase and quadrature signal and outputs a baseband in phase baseband signal and a baseband quadrature baseband signal.

19 Claims, 7 Drawing Sheets

US 8,331,494 B1

COMBINED DIGITAL DOWN CONVERSION (DDC) AND DECIMATION FILTER

CROSS REFERENCE TO RELATED APPLICATIONS

The present application claims priority to U.S. Provisional App. No. 61/118,194 for "Combined Digital Down Conversion (DDC) and Decimation" filed Nov. 26, 2008, the contents of which is incorporated herein by reference in their entirety.

BACKGROUND

The present disclosure generally relates to wireless communication and more specifically to digital down conversion (DDC) and decimation filtering.

Unless otherwise indicated herein, the approaches described in this section are not prior art to the claims in this application and are not admitted to be prior art by inclusion in this section.

Digital down conversion refers to converting a digitized radio frequency (RF) signal that is centered at an intermediate frequency ($f_{IF}$) to a baseband signal centered at a baseband frequency (e.g., zero frequency). FIG. 1 depicts a conventional system 100 for digital down conversion and decimation filtering. A radio frequency signal is received at an analog-to-digital converter (ADC) 102. The radio frequency signal is digitized into a digital signal $S_{ADC}$. ADC 102 samples the radio frequency signal at a sampling rate $f_s$. The resulting digital signal is centered at intermediate frequency $f_{IF}$. The intermediate frequency $f_{IF}$ is typically not at a baseband frequency required for processing by a baseband processor. System 100 performs a digital down conversion to down convert the digital signal $S_{ADC}$ to the baseband frequency.

FIG. 2A illustrates the down conversion. At 202, the digital signal $S_{ADC}$ is centered at the intermediate frequency. After down conversion, the digital signal $S_{ADC}$ is shifted to the baseband frequency, which may be at or near zero. However, in the down conversion, replicas of the signal are also shifted to higher frequencies, such as a frequency $2f_{IF}$. The replicas need to be removed through a decimation filter. FIG. 2B shows a decimation of a higher frequency component of the signal (e.g., a replica) while leaving a signal at the baseband frequency.

Referring back to FIG. 1, a mixer 104a, a mixer 104b, and a local oscillator (LO) 106 are used to down convert the digital signal $S_{ADC}$ to the baseband frequency in a digital down conversion stage 103. Local oscillator 106 inputs a cosine signal into mixer 104a. Also, the cosine signal is shifted by 90 degrees to an inverted sine wave and input into mixer 104b. The output of mixer 104a is a down converted into an in phase signal, $I_{DN}$, and the output of mixer 104b is down converted into a quadrature signal, $Q_{DN}$. In down converting the digital signal $S_{ADC}$, replicas of the digital signal are also generated at higher frequencies. The replicas need to be decimated, thus leaving a baseband in phase (I) signal and a baseband quadrature (Q) signal at the baseband frequency.

A decimation stage 107 separately decimates the in phase signal $I_{DN}$ and the quadrature signal $Q_{DN}$. For example, the in phase signal $I_{DN}$ is decimated using a first decimation filter 108a that includes a first low pass filter (I_LPF) 110a and down sampler 112a, and the quadrature signal $Q_{DN}$ is decimated using a second decimation filter 108b that includes a second low pass filter (Q_LPF) 110b and second down sampler 112b. The resulting output of decimation stage 107 is an I signal and a Q signal at the baseband frequency.

Decimation stage 107 includes separate decimation filters 103a and 103b. For example, a first low pass filter 110a and a down sampler 112a are used to decimate the I signal, and a second low pass filter 100b and a second down sampler 112b are used to decimate the Q signal. Using separate decimation filters 103a and 103b to decimate $I_{DN}$ and $Q_{DN}$ generally requires a lot of power and uses a lot of area

SUMMARY

Particular embodiments generally relate to digital down conversion and decimation filtering of a radio frequency signal. In one embodiment, an analog-to-digital converter (ADC) receives a radio frequency (RF) signal and converts the RF signal into a digital signal at an intermediate frequency. The ADC uses a sampling frequency that is a multiple of the intermediate frequency to perform the conversion. A selector receives the digital signal and outputs a combined in phase and quadrature signal at a data sampling point based on the sampling frequency. A filter receives the combined in phase and quadrature signal and outputs a baseband in phase baseband signal and a baseband quadrature baseband signal.

In one embodiment, an apparatus comprises: an analog to digital converter (ADC) configured to receive a radio frequency (RF) signal and convert the RF signal into a digital signal at an intermediate frequency, the ADC using a sampling frequency that is a multiple of the intermediate frequency to convert the RF signal into the digital signal; a selector configured to receive the digital signal and output a combined in phase and quadrature signal at a plurality of sampling points based the sampling frequency; and a filter configured to receive the combined in phase and quadrature signal and output a baseband in phase signal and a baseband quadrature signal.

In another embodiment, a method comprises: receiving an RF signal; converting the RE signal into a digital signal at an intermediate frequency, wherein converting the RF signal into the digital signal comprises using a sampling frequency that is a multiple of the intermediate frequency; outputting a combined in phase and quadrature signal at a plurality of sampling points based on the sampling frequency; and filtering the combined in phase and quadrature signal to output a baseband in phase signal and a baseband quadrature signal.

In yet another embodiment, an apparatus comprises: a synchronizer configured to output a synchronizing value based on a sampling frequency that is a multiple of an intermediate frequency of a digital signal; a selector configured to: receive the digital signal or an inversion of the digital signal, and output a combined I and Q signal at a plurality of sampling points based on the synchronizing value received from the synchronizer; a delay line of a plurality of delay elements configured to receive the combined I and Q signal and delay the combined I and Q signal through the plurality of delay elements; a first set of taps configured to receive output from a first even set of delay elements in the plurality of delay elements; and a second set of taps configured to receive output from a second odd set of delay elements in the plurality of delay elements; a first output coupled to the first set of taps configured to output a baseband in phase signal for the digital signal; and a second output coupled to the second set of taps to output a baseband quadrature signal for the digital signal.

The following detailed description and accompanying drawings provide a better understanding of the nature and advantages of the present invention.

DETAILED DESCRIPTION

Described herein are techniques for a combined digital down conversion (DDC) and decimation filter. In the following description, for purposes of explanation, numerous examples and specific details are set forth in order to provide a thorough understanding of the present invention. The present invention as defined by the claims may include some or all of the features in these examples alone or in combination with other features described below, and may further include modifications and equivalents of the features and concepts described herein.

Particular embodiments provide a combined digital down conversion and decimation filter. A combined in phase (I) and quadrature (Q) signal is input into a filter. The filter includes two outputs where a baseband I signal is output on a first output and a baseband Q signal is output on a second output.

Figure 3:
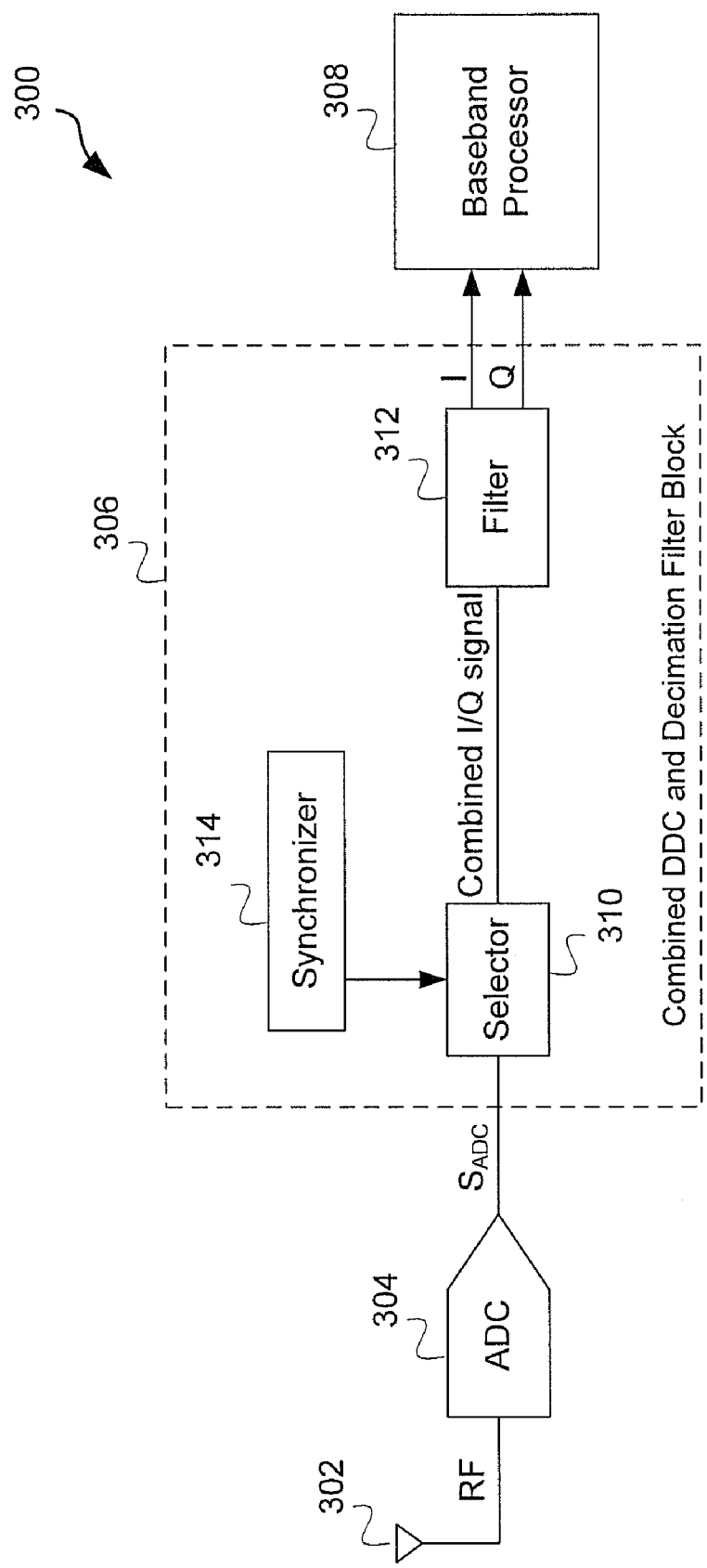
FIG. 3 depicts an example system for performing a digital down conversion and decimation.

FIG. 3 depicts an example system 300 for performing digital down conversion and decimation filtering according to one embodiment. The system 300 may be part of a receiver in a wireless communication system. For example, in one embodiment, system 300 is used as part of the receiver in a global positioning satellite (GPS) system. Although the system 300 is described in the context of a GPS system, system 300 may be used in other systems that require digital down conversion and decimation filtering.

Figure 2A:
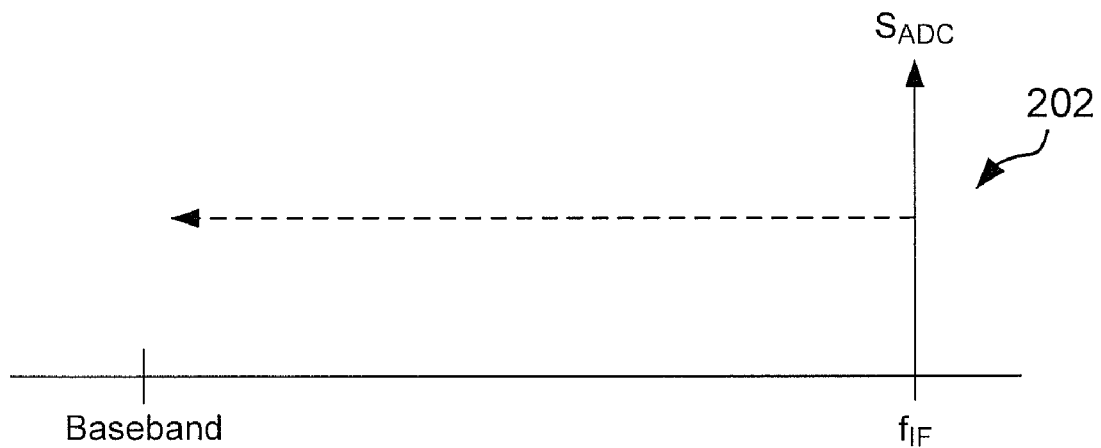
FIG. 2A illustrates a down conversion.
Figure 2B:
FIG. 2B shows a decimation of a digital signal at a higher frequency.

An antenna 302 receives a radio frequency (RF) signal. An analog-to-digital converter 304 converts the RF signal into a digitized signal ($S_{ADC}$). ADC 304 samples the RF signal at a sampling frequency $f_s$. $S_{ADC}$ is in the digital domain but is centered at an intermediate frequency ($f_{IF}$) as depicted in FIG. 2A. As will be described in more detail below, the sampling frequency $f_S$ is a multiple of the intermediate frequency $f_{IF}$.

A combined digital down conversion (DDC) and decimation filter block 306 performs digital down conversion and decimation filtering of the digitized signal $S_{ADC}$ to convert the digitized signal $S_{ADC}$ into a baseband I signal and a baseband Q signal. The baseband I and Q signals respectively correspond to I and Q signals operating at the baseband frequency. Additionally, block 306 decimates replicas of the I and Q signals at higher frequencies.

The baseband I signal and baseband Q signal may be input into a baseband processor 308 for processing. For example, baseband processor 308 may perform a GPS function using the baseband I signal and baseband Q signal.

Block 306 includes a selector 310, a filter 312, and a synchronizer 314. Selector 310 receives the digitized signal $S_{ADC}$ and outputs a combined I and Q signal. In one embodiment, the combined I and Q signal is a signal that includes both an I signal component and a Q signal component. For example, a first data sample includes the I signal component and a second data sample includes the Q signal component. In one embodiment, the combined I and Q signal is provided on a single line into filter 312. However, the combined I and Q signal may be provided on multiple lines into filter 312 and combined in filter 312.

Synchronizer 314 outputs a synchronizing value that causes selector 310 to select a data sample of the digitized signal $S_{ADC}$ (either the real value or inversion of the digitized signal $S_{ADC}$) to output into filter 312. In one embodiment, synchronizer 314 is an N bit counter that outputs a bit value at a sampling point based on the sampling frequency that was used by ADC 304.

In one embodiment, the sampling frequency $f_s$ is a multiple of the intermediate frequency $f_{IF}$. For example, in one implementation, the sampling frequency $f_s$ is four times that of the intermediate frequency $f_{IF}$—i.e., $f_s=4f_{IF}$. Although a multiple of 4 is described as an example herein, other multiples may be used.

The digital down conversion is simplified by using four times that of the intermediate frequency because coefficients of 1, 0, -1, 0 values of a cosine and inverted sine wave result at sampling points. This concept is described with respect to FIG. 1 and FIG. 4A. In particular, this description describes signals that are output by mixers 104a and 104b of FIG. 1. Referring back to FIG. 1, the down converted I signal is output from mixer 104a by mixing a cosine wave with the digitized signal $S_{ADC}$, and the down converted Q signal is output from mixer 104b by mixing an inverted sine wave with the digitized signal $S_{ADC}$. When a sampling point is taken, the value of the cosine wave and inverted sine wave is used.

Figure 1:
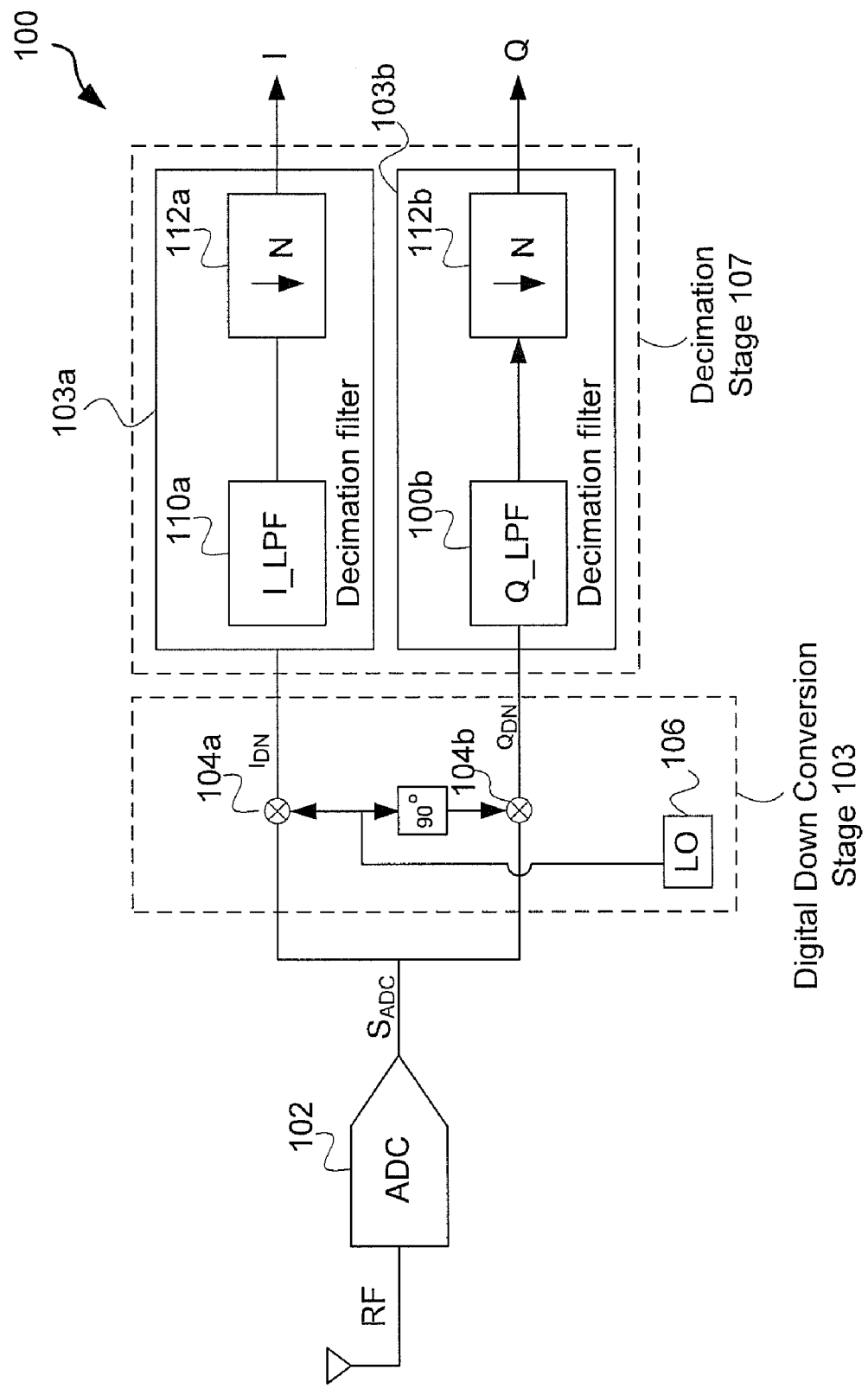
FIG. 1 depicts a conventional system for digital down conversion and decimation filtering.
Figures 4A, 4B:
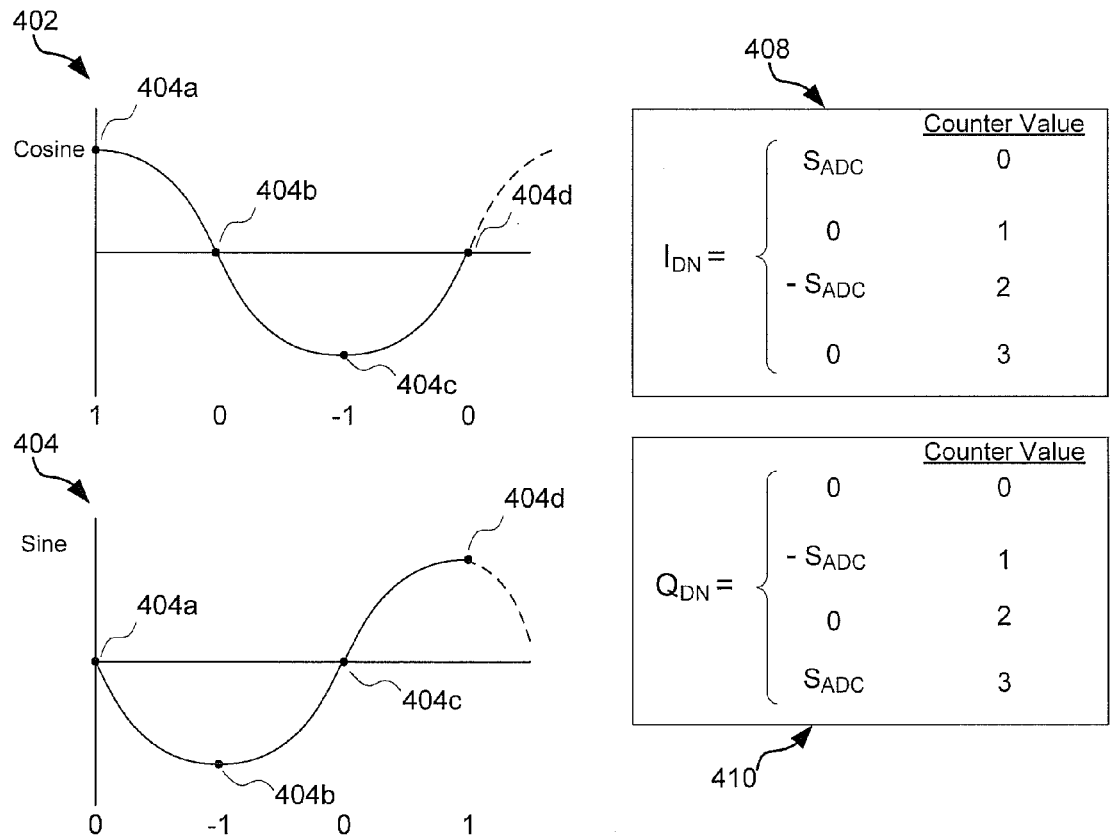
FIG. 4A shows the sampling points of FIG. 1 for the cosine and inverted sine wave.
FIG. 4B shows values for the combined I and Q signal.

FIG. 4A shows the sampling points for the cosine and inverted sine wave of FIG. 1. If the sampling frequency is chosen to be a multiple (e.g., 4) of the intermediate frequency $f_{IF}$, the digitized signal is sampled at points shown in graph 402 for the cosine wave and graph 404 for the sine wave. At sampling points 404a-404d, the resulting values are 1, 0, -1, and 0 for the cosine signal and 0, -1, 0, and 1 for the inverted sine wave.

The values at sampling points 404a to 404d are mixed with the digitized signal $S_{ADC}$ to down convert the digitized signal $S_{ADC}$. Using the values of 1, 0, or -1 simplifies a result of the mixing. Legend 408 of FIG. 4A illustrates the resulting values for the I signal after being multiplied by the coefficients for the cosine wave at sampling points 404a-404d. At sampling point 404a, the coefficient is 1 and the value for the I signal is $S_{ADC}$. At point 404b, the coefficient is zero and the value for the I signal is zero. At sampling point 404c, the coefficient is -1 and the value for the I signal is inverted—i.e., $-S_{ADC}$. At point 404d, a coefficient is 0 and the value for the I signal is 0. Legend 410 illustrates the resulting values for the Q signal where sampling points 404b and 404d have the coefficient values of -1 and 1, respectively, and the value of the Q signal is $-S_{ADC}$ at sampling point 404b and $S_{ADC}$ at sampling point 404d. The coefficient is 0 for sampling points 404a and 404c and the value for the Q signal is 0.

As can be seen from the values shown in legends 408 and 410, the values for the I signal and the Q signal alternate with 0. Also, when a value is passed for the I signal (either $S_{ADC}$ or $-S_{ADC}$), the Q signal is equal to 0, and when the value for the Q signal is either $S_{ADC}$ or $-S_{ADC}$, the value for the I signal is 0. For example, at point 404a, the value passed for the I signal is $S_{ADC}$ and the value for the Q signal is 0. However, at point 404b, the value passed for the Q signal is $-S_{ADC}$ and the value for the I signal is 0.

FIG. 4B shows values for the combined I and Q signal according to one embodiment. The combined I and Q signal includes both the I component and Q component by eliminating the 0 values that were normally used. Legend 412 shows the values of the combined I and Q signal. The values of $S_{ADC}$ (I component), $-S_{ADC}$ (Q component), $-S_{ADC}$ (I component), and $S_{ADC}$ (Q component) are used for the combined I and Q signal instead of the separate I signal and Q signal values shown in FIG. 4A. The counter values shown in FIGS. 4A and 4B will be described in more detail below.

Referring back to FIG. 3, system 300 leverages the above concept that at a data sampling point, only one of the I signal or Q signal has a value and the other signal is 0. The 0 values for the I signal and the Q signal can be ignored by filter 312 to determine the baseband I signal and baseband Q signal. Selector 310 may not output the 0 values that would result for the sampling points for either the I signal or Q signal. Rather, selector 310 outputs data samples of the signal $S_{ADC}$ that are either $S_{ADC}$ or $-S_{ADC}$. By not outputting the 0 values, the I signal and Q signal are combined and may be input into a filter using a single line. For example, at point 404a, the value of $S_{ADC}$ may be passed for the I signal. Then, at point 404b, the value of $-S_{ADC}$ may be passed for the Q signal.

Filter 312 decimates and down samples the combined I and Q signal and outputs a baseband I signal and a baseband Q signal. For example, filter 312 includes a first output for the baseband I signal and a second output for the baseband Q signal. As will be discussed below in more detail, a single delay line of filter 312 operates on the combined I and Q signal. This simplifies the structure performing the digital down conversion and decimation depicted in FIG. 1 because separate decimation filters for the I signal and the Q signal are not needed in particular embodiments. The single filter, however, includes two outputs that are used to determine the baseband I signal and the baseband Q signal.

Figure 5:
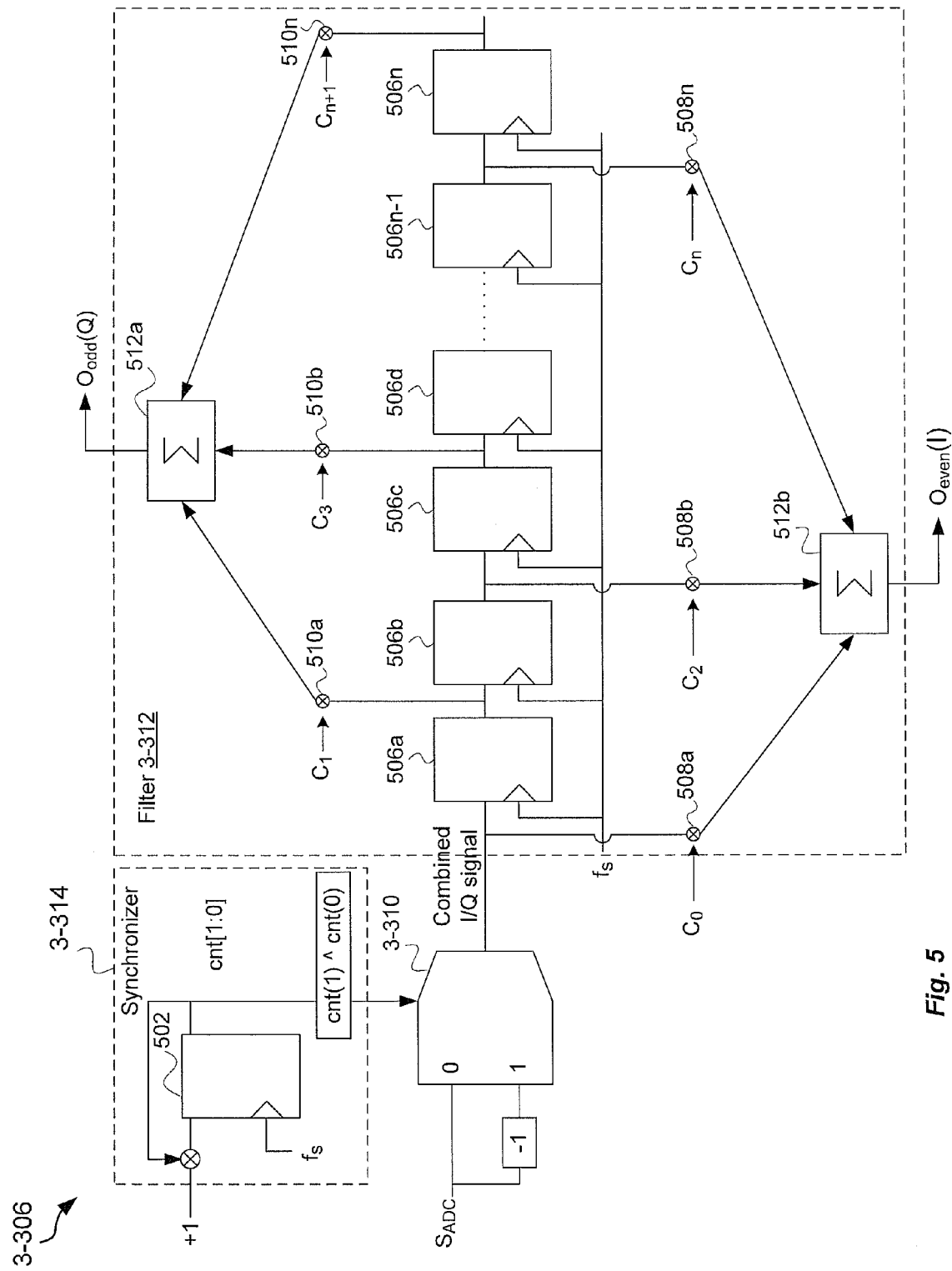
FIG. 5 depicts a more detailed example of a combined digital down conversion (DDC) and decimation filter block.

FIG. 5 depicts a more detailed example of block 3-306 according to one embodiment. The signal $S_{ADC}$ is input into selector 3-310. In one embodiment, block 3-306 uses one delay line and one filter's computation hardware to realize the digital down conversion, two decimation filters, and down sampling of FIG. 1 to convert the signal $S_{ADC}$ to the baseband I signal and baseband Q signal. Although the structure in FIG. 5 is described, other implementations are possible. For example, different filter, synchronizer, or selector structures may be used.

Synchronizer 3-314 outputs the synchronizing value. In one embodiment, synchronizer 3-314 includes elements that implement a counter. For example, the synchronizing value may be values from a two bit counter (cnt[1:0]). Synchronizer 3-314 receives the sampling frequency $f_s$ that is input into ADC 3-304 at a flip-flop 502. A counter value (cnt[1]^cnt[0]) is then output from synchronizer 3-314 based on the sampling frequency $f_s$. For example, the synchronizing value is then output at data sampling points 404a-404d. In one embodiment, the values output from synchronizer 3-314 may be 0, 1, 2, and 3. Other counter values may also be used depending on the order of the filter used.

Selector 3-310 selects a data sample of $S_{ADC}$ or $-S_{ADC}$ depending on the synchronizing value received from synchronizer 3-314. Selector 3-310 may be any element or elements that can output a data sample of $S_{ADC}$ or $-S_{ADC}$. Also, although synchronizer 3-314 and selector 3-310 are described, it will be understood that other structures may be used to synchronize outputting of $S_{ADC}$ or $-S_{ADC}$ at data sampling points 404a-404d.

Selector 3-310 selects one of $S_{ADC}$ or $-S_{ADC}$ depending on whether $S_{ADC}$ should be inverted or not. Referring to FIG. 4, in boxes 408 or 410, zero values for the I signal component or Q signal component are not passed. At counter values 0 and 3, zero values are not passed for the I signal and at counter values 0 and 2, zero values are not passed for the Q signal. Accordingly, the values output on the combined I and Q signal at counter values 0, 1, 2, and 3 are $S_{ADC}$ component), $-S_{ADC}$ (Q component), $-S_{ADC}$ (I component), and $S_{ADC}$ component) after four clock cycles.

As each synchronizing value is received, a data sample is output into filter 3-312. By synchronizing the data sampling with a multiple of four of the sampling frequency, the I component and Q component may be output in an alternating fashion from selector 3-310 into filter 3-312. This is because the value for the I or Q component will be $S_{ADC}$ or $-S_{ADC}$. If a data sampling point is taken when the values for the cosine or inverted sine wave are not (1, 0, −1, 0) or (0, −1, 0, 1), then the I components and the Q components may not be combinable into a single signal into filter 3-312 because alternating zero values would not result. For example, if a sampling point results in two non-zero coefficients for the cosine and inverted sine wave, a zero value does not result for one of the I signal or Q signal.

In one embodiment, filter 3-312 is a finite impulse response (FIR) filter. It will be recognized that other filters may be used, such as infinite impulse response (IIR) filters. Filter 3-312 includes flip flops 506a-506n, mixers 508a to 508n and 510a to 510n, and summation blocks 512a and 512b. In one embodiment, filter 3-312 includes computational hardware for only a single filter A delay line includes the set of flip-flops 506a-506n and receives the combined I and Q signal. At each clock cycle of the sampling frequency, flip flops 506a-n output a data sample. The data sample is delayed by each flip flop 506.

Filter 3-312 includes a number of taps, where a tap is a coefficient/delay pair. The coefficient/delay pair is one flip flop 506 and a mixer 508 that mixes an output of flip flop 506 with a coefficient. For example, flip flop 506a and mixer 508a form a coefficient/delay pair. The number of taps is the filter order, N.

Filter 3-312 also includes two outputs $O_{odd}$ and $O_{even}$. Each output is calculated using a multiply-accumulate (MAC) operations for a set of taps. A MAC is the operation of multiplying a coefficient by the corresponding delayed data sample and accumulating the result. For example, a delayed sample output by flip flop 506a is multiplied by a coefficient $C_1$ at mixer 508a. The result is accumulated in an accumulator 512a with other MAC operations from the set of taps.

In one embodiment, output $O_{odd}$ is calculated using MAC operations for a different set of taps from the set of taps used to calculate output $O_{even}$. For example, output $O_{even}$ uses taps positioned in an even position in the delay line (e.g., N=0, 2, 4, 6, ..., n) and $O_{odd}$ uses taps positioned in an odd position in the delay line (e.g., N=1, 3, 5, 7, ..., n−1). It should be noted that an even positioned tap also includes the zero position, e.g., mixer 508a and $C_0$.

Outputs $O_{odd}$ and $O_{even}$ may be calculated every K clock cycles depending on the order of the filter. For example, if N=2, the output $O_{odd}$ and $O_{even}$ are calculated every two clock cycles. This calculation is performed such that the I components and the Q components of the combined I and Q signal are tapped to the right output $O_{odd}$ and $O_{even}$. The combined I and Q signal includes both I components and Q components. The calculation is performed when the I and Q components are output onto taps that go to the proper output for the MAC operation. Depending on the order of the filter, the baseband I signal and baseband Q signal may be sent to different outputs. If the calculation is performed when the synchronizing value, cnt[1:0], is 0 and 2, then the baseband I signal is output at the output $O_{even}$ and the baseband Q signal is output at the output $O_{odd}$.

The 0 values for the I signal and Q signal have been omitted in the combined I and Q signal. The 0 values would not have contributed to the MAC operation and thus do not affect the decimation and down sampling being performed by filter 3-312. In concept, a 0 value for the I signal is replaced by a value for the Q signal, and vice versa, in the combined I and Q signal. By calculating the outputs $O_{even}$ and $O_{odd}$ at taps where the I component and Q component are located at certain calculation times, the combined I and Q signal can be converted to the baseband I signal and the baseband Q signal using a single filter 3-312 with two outputs.

In one example, at counter value=0, an I component of the combined I and Q signal is provided to mixer 508a. The I component is multiplied by a coefficient $C_0$ and the result is summed in accumulator 512b. The I component is also input into flip flop 506a during this cycle.

At counter value=1, the I component is output from flip-flop 506a and input into flip flop 506b. Also, a Q component is output from selector 3-310 and input into flip flop 506a. At this count, a MAC operation is not performed because at this count, a 0 value would have been present for the I component.

At a counter value=2, the I component is output from selector 3-310 and output from flip flop 506b, and the Q component is output from flip-flop 506a. A calculation is then performed. The I component output from flip flop 506b is multiplied by coefficient $C_2$. Also, the I component output from selector 3-310 is multiplied by coefficient $C_0$ and the results of both multiplications are summed in accumulator 512b. The Q component is output by flip flop 506a and multiplied by coefficient $C_1$. The result is summed in accumulator 512a. This process continues as a MAC operation is performed for the data samples being delayed every two cycles.

The coefficients of filter 3-312 may be set such that the sum for the data samples decimates the replicas of the signal at frequencies other than the baseband and down samples the I and Q signals.

It will be understood that outputs $O_{even}$ and $O_{odd}$ may be calculated at a different number of cycles. For example, if $N \geq 8$, the counter is expanded to more than two bits. If N=1, the I component is found at output $O_{ven}$ at counter value=0 and at output $O_{odd}$ at the counter value=1. The Q component is reversed, that is, the Q component is found at output $O_{odd}$ at counter value=0, and at output $O_{even}$ at the counter value=1. Thus, outputs $O_{even}$ and $O_{odd}$ may not be calculated on dedicated outputs, but may alternate. Logic is provided to calculate the baseband I signal and baseband Q signal when different outputs alternatively output the I signal and the Q signal.

Accordingly, filter 3-312 includes multiple outputs that convert a digital signal to a baseband frequency while decimating other replicas of the signal at higher frequencies. A combined I signal and Q signal is used as input to filter 3-312. The use of multiple filters for the I signal and the Q signal is eliminated in particular embodiments. This simplifies the design and uses less power and area.

Figure 6:
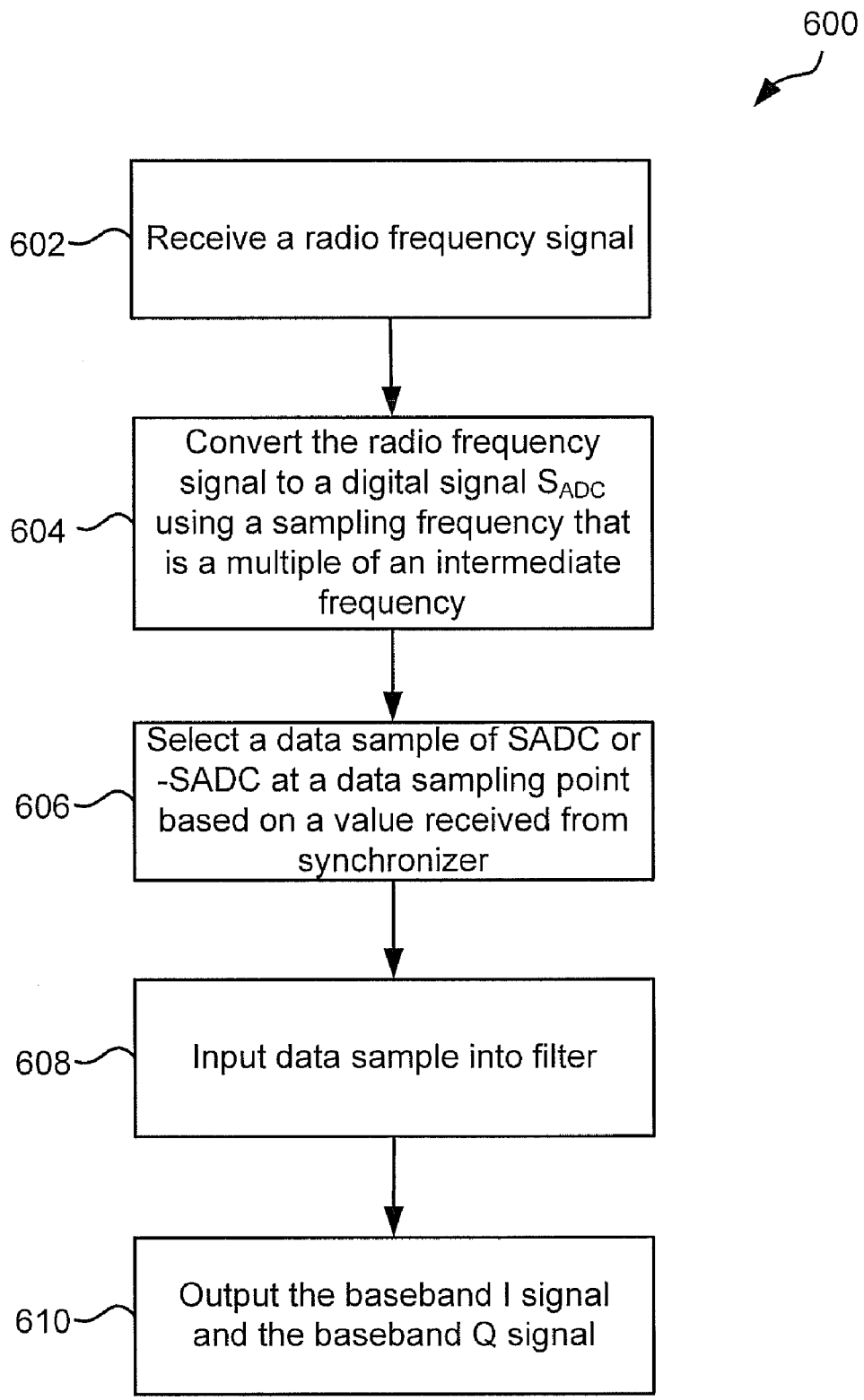
FIG. 6 depicts a simplified flowchart of an example method for performing the digital down conversion and decimation filtering.

FIG. 6 depicts a simplified flowchart 600 of method for performing the digital down conversion and decimation filtering according to one embodiment. At 602, ADC 3-304 receives a radio frequency signal. At 604, ADC 304 converts the radio frequency signal to a digital signal $S_{ADC}$ using the sampling frequency that is a multiple of the intermediate frequency.

At 606, selector 3-310 selects a data sample of $S_{ADC}$ or $-S_{ADC}$ at a sampling point based on a value received from synchronizer 3-314. At 608, the data sample is input into filter 3-312. It will be understood that multiple data samples are selected and input into filter 3-312. At 610, filter 3-312 outputs the baseband I signal and the baseband Q signal. For example, filter 3-312 processes the data samples as described above.

Figure 7:
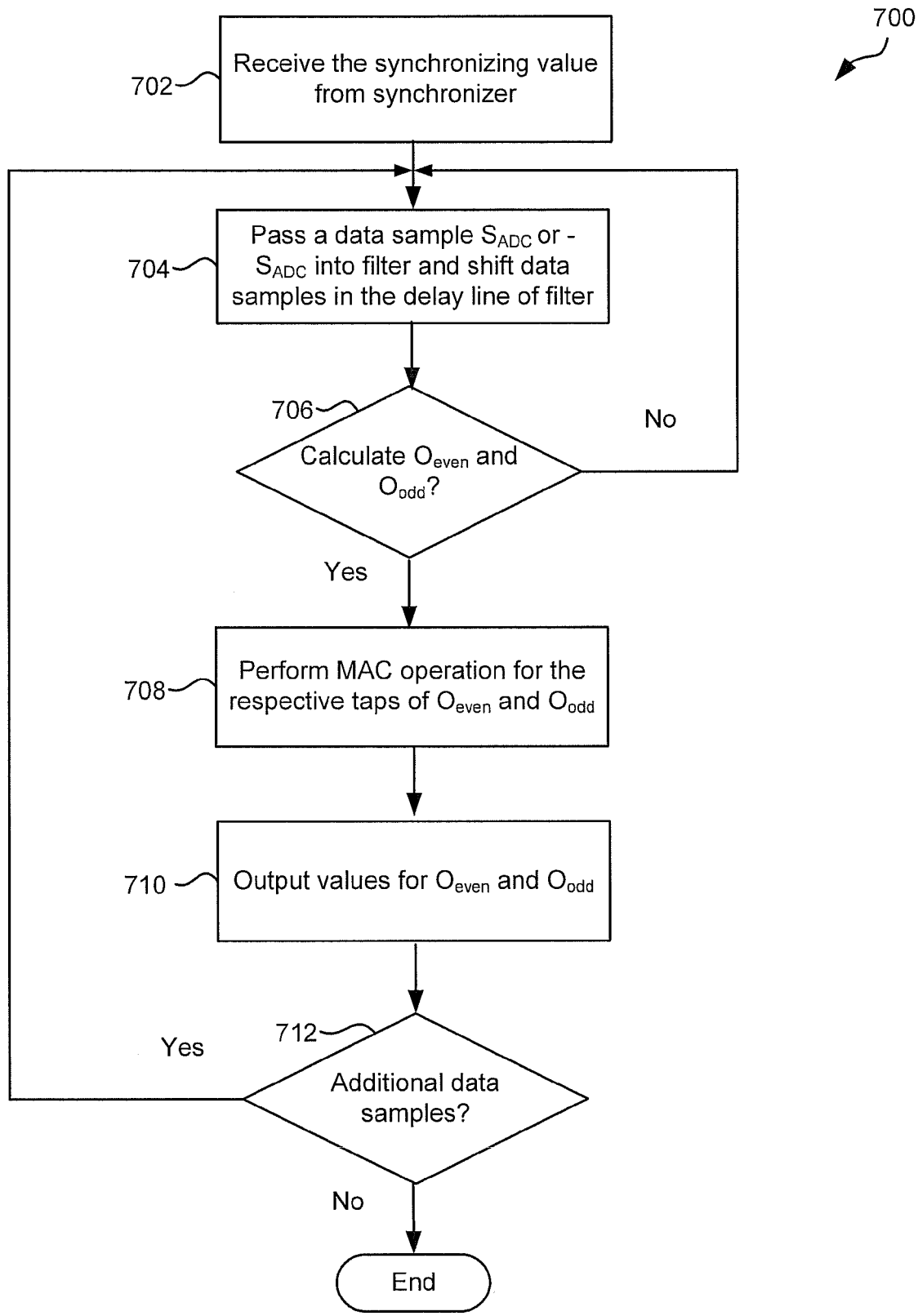
FIG. 7 depicts a simplified flowchart of an example method for performing the digital down conversion and decimation filtering in a digital down conversion block.

FIG. 7 depicts a simplified flowchart 700 of method for performing the digital down conversion and decimation filtering in DDC block 3-306 according to one embodiment. At 702, selector 3-310 receives the synchronizing value from synchronizer 3-314. At 704, selector 3-310 passes a data sample $S_{ADC}$ or $-S_{ADC}$ into filter 3-312 and data samples in the delay line of filter 3-312 are shifted.

At 706, it is determined if outputs $O_{even}$ and $O_{odd}$ should be calculated. This determination is made based on the synchronizing value. If not, the method reiterates to 704 where another data sample is selected and data samples in the delay line are shifted.

At 708, if outputs $()_{ven}$ and $O_{odd}$ should be calculated, a MAC operation is performed for the respective taps of outputs $O_{even}$ and $O_{odd}$. At 710, the values for outputs $O_{even}$ and $O_{odd}$ are output. At 712, it is determined if additional data samples need to be processed. If not, the method ends. If additional data samples need to processed, the method reiterates to step 704.

Accordingly, a combined DDC and decimation filter block is provided. A single filter may be used to output the in phase signal and the quadrature signal at the baseband frequency.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   an analog to digital converter (ADC) configured to receive a radio frequency (RF) signal and convert the RF signal into a digital signal at an intermediate frequency, the ADC using a sampling frequency that is a multiple of the intermediate frequency to convert the RF signal into the digital signal;
   a selector configured to
      receive the digital signal; and
      output a combined in-phase and quadrature signal at a plurality of sampling points based on the sampling frequency, wherein the selector alternatively outputs a data sample of the digital signal or an inversion of a data sample of the digital signal as the combined in-phase and quadrature signal; and
   a filter configured to receive the combined in-phase and quadrature signal and output a baseband in-phase signal and a baseband quadrature signal.

2. The apparatus of claim 1, wherein the multiple comprises a factor of four of the intermediate frequency.

3. The apparatus of claim 1, further comprising a synchronizer configured to output a synchronizing value to the selector based on the sampling frequency, the synchronizing value causing the selector to output the data sample of the digital signal or the inversion of the data sample of the digital signal.

4. The apparatus of claim 1, wherein the filter comprises:
a first output configured to output the baseband in-phase signal; and
a second output configured to output the baseband quadrature signal.

5. The apparatus of claim 1, wherein the combined in-phase and quadrature signal is received on a single input into a delay line of a plurality of delay elements in the filter.

6. The apparatus of claim 5, wherein the filter comprises:
a first output coupled to a first set of taps to the delay line; and
a second output coupled to a second set of taps to the delay line.

7. The apparatus of claim 6, wherein:
the first set of taps is coupled to delay elements positioned in an even position in the delay line; and
the second set of taps is coupled to delay elements positioned in an odd position in the delay line.

8. The apparatus of claim 6, wherein the filter performs a first multiply-accumulate operation with the first set of taps and the filter performs a second multiple-accumulate with the second set of taps at a calculation time, the calculation time determined based on a positioning of in-phase (I) components at the first set of taps and quadrature (Q) components of the combined I and Q signal at the second set of taps.

9. The apparatus of claim 1, wherein the filter comprises a finite impulse response (FIR) filter.

10. A global positioning satellite (GPS) system further comprising the apparatus of claim 1.

11. A method comprising:
receiving a radio frequency (RF) signal;
converting the RF signal into a digital signal at an intermediate frequency, wherein converting the RF signal into the digital signal comprises using a sampling frequency that is a multiple of the intermediate frequency;
outputting a combined in-phase and quadrature signal at a plurality of sampling points based on the sampling frequency, wherein outputting comprises outputting a data sample of the digital signal or an inversion of a data sample of the digital signal as the combined in-phase and quadrature signal; and
filtering the combined in-phase and quadrature signal to output a baseband in-phase signal and a baseband quadrature signal.

12. The method of claim 11, wherein:
the baseband in-phase signal is output on a first output; and
the baseband quadrature signal is output on a second output.

13. The method of claim 12, wherein filtering comprises:
determining when in-phase (I) components of the combined in-phase and quadrature signal are located in a position to be used in a first calculation for the first output;
determining when quadrature (Q) components of the combined in-phase and quadrature signal are located in a position to be used in a second calculation for the second output; and
performing the first calculation for the first output and the second calculation for the second output.

14. The method of claim 11, further comprising inputting the combined in-phase and quadrature signal into a single delay line of a filter performing the filtering.

15. An apparatus comprising:
a synchronizer configured to output a synchronizing value based on a sampling frequency that is a multiple of an intermediate frequency of a digital signal;
a selector configured to:
receive the digital signal or an inversion of the digital signal, and
output a combined in-phase (I) and quadrature (Q) signal at a plurality of sampling points based on the synchronizing value received from the synchronizer;
a delay line of a plurality of delay elements configured to receive the combined I and Q signal and delay the combined I and Q signal through the plurality of delay elements;
a first set of taps configured to receive output from a first even set of delay elements in the plurality of delay elements;
a second set of taps configured to receive output from a second odd set of delay elements in the plurality of delay elements;
a first output coupled to the first set of taps configured to output a baseband in-phase signal for the digital signal; and
a second output coupled to the second set of taps to output a baseband quadrature signal for the digital signal.

16. The apparatus of claim 15, wherein the plurality of delay elements comprise a plurality of flip flops.

17. The apparatus of claim 15, wherein taps in the first set of taps comprise a first set of mixers, each first mixer configured to multiply output from a first delay element with a first coefficient and wherein the second set of taps comprise a second set of mixers, each second mixer configured to multiply output from a second delay element with a second coefficient.

18. The apparatus of claim 17, wherein:
the plurality of first mixers receive output from delay elements in even positions in the delay line; and
the plurality of second mixers receive output from delay elements in odd positions in the delay line.

19. The apparatus of claim 17, further comprising a first accumulator coupled to the first set of taps and a second accumulator coupled to the second set of taps, the first accumulator accumulating output from the first set of mixers and the second accumulator accumulating output from the second set of mixers.

* * * * *